(12) United States Patent
Lin

(10) Patent No.: US 8,674,249 B2
(45) Date of Patent: Mar. 18, 2014

(54) CAPACITIVE TOUCH PAD

(75) Inventor: Teh-Zheng Lin, Taoyuan (TW)

(73) Assignee: Young Fast Optoelectronics Co., Ltd., KuanYin, TaoYuan (TW)

(*) Notice: Subject to any disclaimer, the term of this patent is extended or adjusted under 35 U.S.C. 154(b) by 796 days.

(21) Appl. No.: 12/859,785

(22) Filed: Aug. 20, 2010

(65) Prior Publication Data

US 2012/0044189 A1    Feb. 23, 2012

(51) Int. Cl.
*H03K 17/975*    (2006.01)

(52) U.S. Cl.
USPC ........................................................ 200/600

(58) Field of Classification Search
USPC .......... 200/600, 46, 5 R, 292, 511–512, 11 D, 200/11 DA, 5 A
See application file for complete search history.

(56) References Cited

U.S. PATENT DOCUMENTS

| | | | |
|---|---|---|---|
| 2011/0096005 A1* | 4/2011 | Kim et al. ...................... 345/173 |
| 2011/0141055 A1* | 6/2011 | Hsu ................................. 345/174 |
| 2011/0285661 A1* | 11/2011 | Hotelling ....................... 345/174 |
| 2011/0308929 A1* | 12/2011 | Kim et al. ...................... 200/600 |
| 2012/0132511 A1* | 5/2012 | Tanaka et al. ................. 200/600 |
| 2012/0133613 A1* | 5/2012 | Chen et al. .................... 345/174 |

* cited by examiner

*Primary Examiner* — Edwin A. Leon
*Assistant Examiner* — Anthony R. Jimenez

(57) ABSTRACT

A capacitive touch panel has precise etching lines formed on a transparent conductive film so as to form with a desired pattern. As a result, the hollowed portion on the conductive film will be reduced greatly and thus the flatness of the capacitance sensing structure will be improved and the transmittances in different areas will tend to be uniform. Thus the image distortion in the screen below the touch panel will be improved. Besides, the etching lines will divide the waste etching areas on the conductive lines into a plurality of small units which can reduce the capacitances of the noises.

4 Claims, 5 Drawing Sheets

CAPACITIVE TOUCH PAD

FIELD OF THE INVENTION

The present invention related to a capacitive touch panel, in particular to a capacitive touch panel with uniform light transmittances and having lower noise capacitance.

BACKGROUND OF THE INVENTION

A capacitance touch panel will has capacitance effect by a touching to the panel. The variation of the capacitance is used to detect the touch position so as to achieve the object of signal input. The capacitance touch panel can be inputted by fingers so that the input operation is very convenient. No large pressure is applied to the panel and thus no damage will generate in the panel. Furthermore, the elements of the panel are less and yield rate is high so that it is suitable to mass production with less cost. Thus it is widely used in communication, computers and other consumer devices.

In prior art capacitance touch panels, a plurality of X traces and Y traces are intersectedly arranged. The capacitive sensing units of the X traces and Y traces are arranged as a metric in the working area of the touch panel. The X traces and Y traces are made of transparent conductive film, such as indium tin oxide. Undesired portions are etched away so as to generate the capacitance sensing areas. The different capacitance sensing areas are spaced by proper gaps for insulation. However, the areas having the capacitance sensing area and the etched portions (namely, the hollowed portions of the conductive films) have different light transmittances so that the light deflections at different areas are not uniform. Thus it will form as a pattern in the human eyes. As the touch panel is arranged in front of a panel, the images will deform and distort.

SUMMARY OF THE INVENTION

Thereby, the object of the present invention is to provide an improved capacitance touching panel. Precise etching lines are formed on a transparent conductive film so as to form with a desired pattern. As a result, the hollowed portion on the conductive film is reduced greatly and thus the flatness of the capacitance sensing structure will be improved and the transmittances in different areas will tend to be uniform. Thus the image distortion in the screen below the touch panel is improved. Besides, the etching lines divide the waste etching areas on the conductive lines into a plurality of small units which can reduce the capacitances of the noises.

To achieve above object, the present invention provides a capacitive touch panel comprising: a first axial sensing layer formed on a main surface of a first substrate; a plurality of etching lines dividing the first axial sensing layer into a desired pattern containing a plurality of parallel first axial sensing traces and a plurality of waste etching areas; each of the axial sensing traces of the first axial sensing layer having a plurality of capacitive sensing units which are connected one by one; each the waste etching areas of the first axial sensing layer being divided into a plurality of discontinuous small units; a second axial sensing layer formed on a main surface of a second substrate; a plurality of etching lines dividing the second axial sensing layer into a desired pattern containing a plurality of parallel second axial sensing traces and a plurality of waste etching areas; each of the axial sensing traces of the second axial sensing layer having a plurality of capacitive sensing units which are connected one by one; each the waste etching areas of the second axial sensing layer being divided into a plurality of discontinuous small units; and an insulating layer for isolating the first axial sensing layer and the second axial sensing layer so as to form as a transparent plate; the first axial sensing traces and the second axial sensing traces being intersected orthogonally so that the capacitive sensing units of the first axial sensing traces and the second axial sensing traces are formed as a metric; one end of each of the first axial sensing traces and the second axial sensing traces being connected to a conductive wire at an edge of the respective axial sensing layer so that capacitive sensing signals from the capacitive sensing units can be transferred to a succeeding signal processing circuit.

The various objects and advantages of the present invention will be more readily understood from the following detailed description when read in conjunction with the appended drawing.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
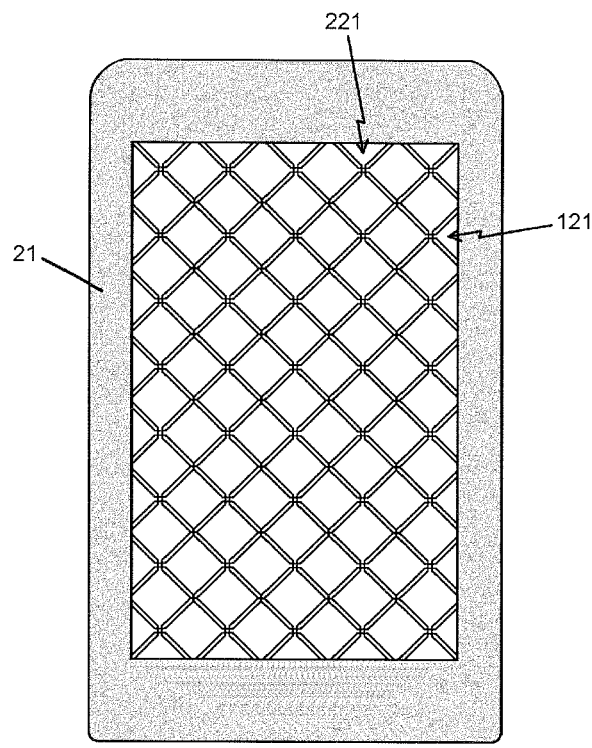
FIG. 1 is a plane view about the structure of the first embodiment of the present invention.
Figure 2:
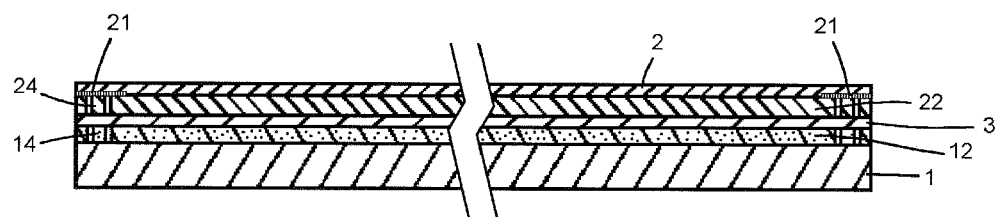
FIG. 2 is a lateral cross section view about the structure of the first embodiment of the present invention.

With reference to FIGS. 1 and 2, a preferred embodiment of the present invention is illustrated. The capacitive touch sensor of the present invention includes a lower substrate 1 and an upper panel 2. Each upper surface of the lower substrate 1 and the upper panel 2 is installed with a capacitive sensing layer 12, 22. A gluing combining layer 3 is installed between the lower capacitive sensing layer 12 and the upper capacitive sensing layer 22. Each of the lower substrate 1 and the upper panel 2 is made of highly transparent material and is a planar or non-planar thin plate. The material of the lower substrate 1 and the upper panel 2 is selected from one of Polycarbonate (PC), polyester (PET), Polymethyl methacrylate (PMMA), or Cyclic olefin copolymer (COC), etc. However, these are not used to confine the scope of the present invention. Various soft or hard thin plates are usable. The combining layer 3 is selected from insulated transparent UV glue, OCA glue or IR glue.

Figure 4:
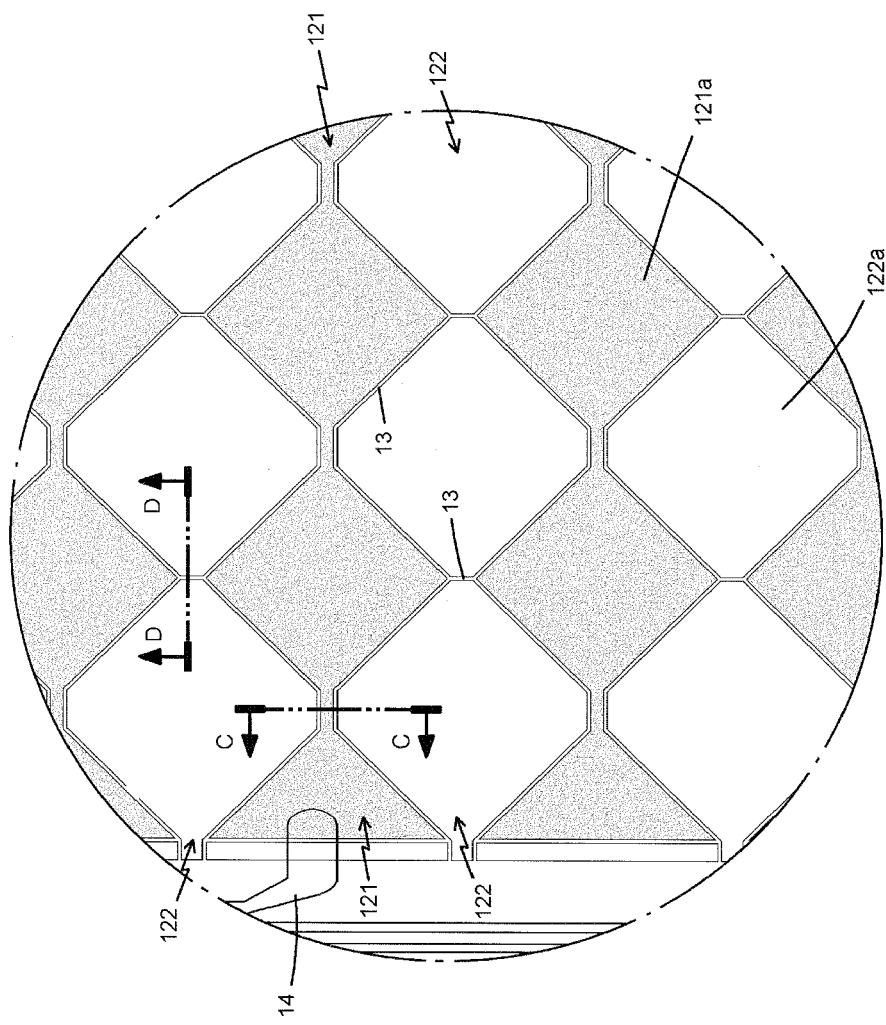
FIG. 4 is a schematic view about the A portion in FIG. 3.
Figure 3:
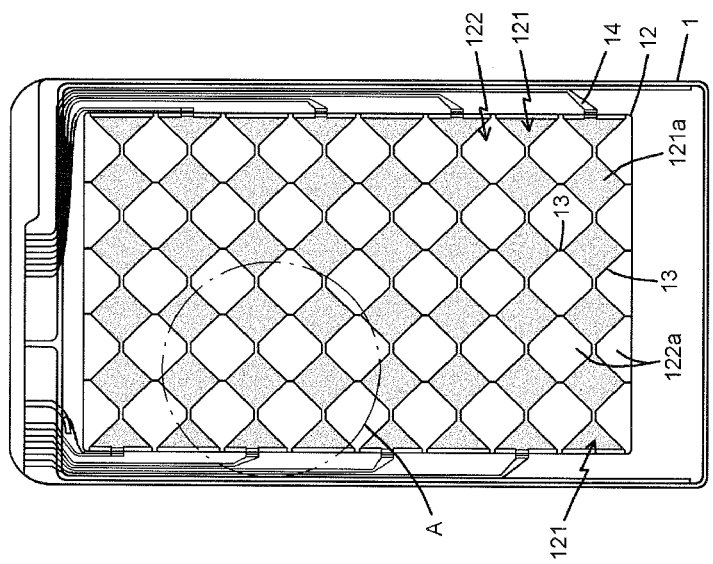
FIG. 3 is a plane view about the lower substrate of the first embodiment of the present invention.

Referring to FIGS. 3 and 4, an upper surface of the lower substrate 1 is installed with the lower capacitive sensing layer 12. The lower capacitive sensing layer 12 is a transparent conductive thin film made of indium tin oxide. Etching lines 13 are formed on the lower capacitive sensing layer 12 by etching process so as to from a desired pattern. The etching process is selected from dry etching, such as laser etching, plasma etching, etc. or wet etching is used, such as printing etching, yellow light etching, ink jetting etching, etc. The pattern on the lower capacitive sensing layer 12 may be a plurality of parallel X traces 121 and a waste etching area 122. Each X trace 121 has a plurality of diamond shape capacitive sensing units 121a. One end of each X trace 121 is electrically connected to a signal conductive wire 14 at an edge of the lower substrate 1. The waste etching area 122 on the lower capacitive sensing layer 12 is divided into a plurality of discontinuous small units 122a.

Figure 6:
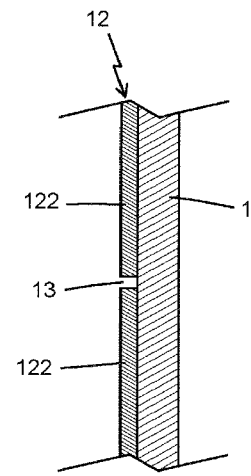
FIG. 6 is a lateral cross section view about the line D-D of the FIG. 4.
Figure 7:
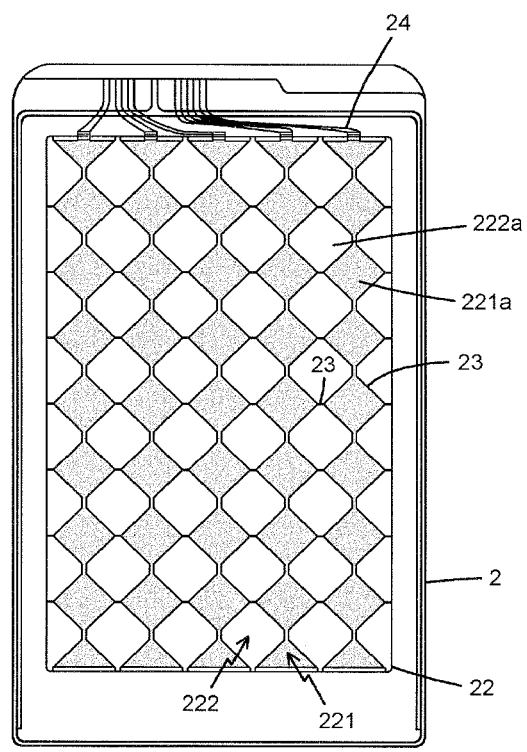
FIG. 7 is a plane view about the upper panel of the first embodiment of the present invention.
Figure 8:
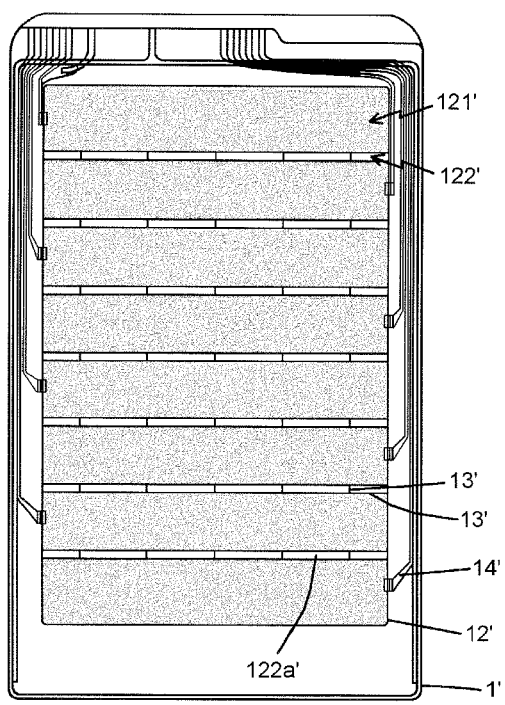
FIG. 8 is a plane view about the lower substrate of the second embodiment of the present invention.
Figure 9:
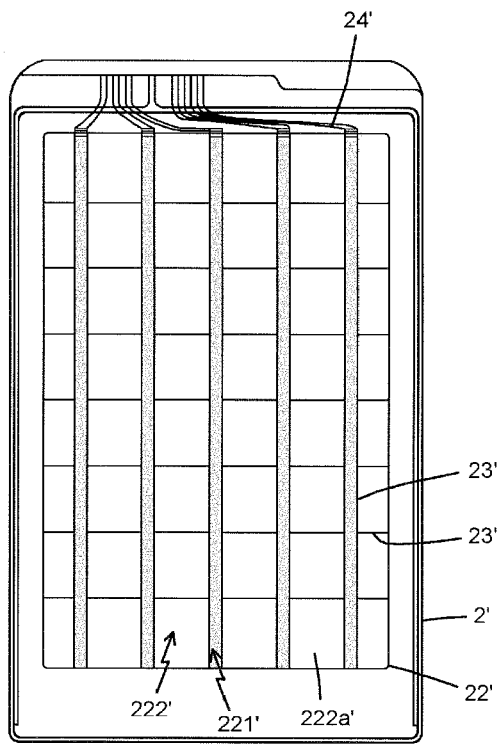
FIG. 9 is a plane view about the upper panel of the second embodiment of the present invention.
Figure 10:
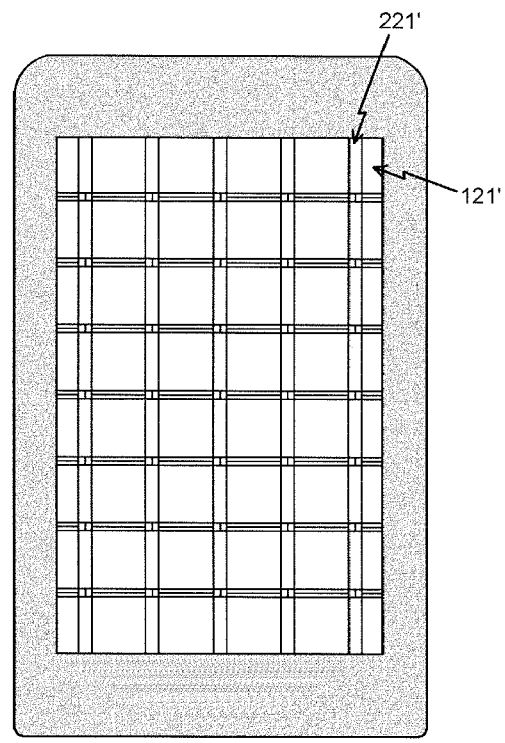
FIG. 10 is a plane view about the structure of the second embodiment of the present invention.
Figure 11:
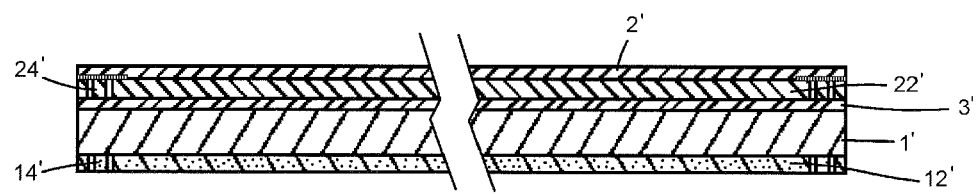
FIG. 11 is a lateral cross section view about the structure of the second embodiment of the present invention.

Similarly, as illustrated in FIG. 6, a lower surface of the upper panel 2 is installed with an upper capacitive sensing layer 22. The upper capacitive sensing layer 22 is a transparent conductive thin film made of indium tin oxide. Etching lines 23 are formed on the upper capacitive sensing layer 22 by laser etching process so as to form a desired pattern. The pattern on the upper capacitive sensing layer 22 may be a plurality of parallel Y traces 221 and a waste etching area 222. Each Y trace has a plurality of diamond shape capacitive sensing units 221a. One end of each Y trace is electrically connected to a signal conductive wire 24 at an edge of the lower substrate 1. The waste etching area 222 on the upper capacitive sensing layer 22 is divided into a plurality of discontinuous small units 222a.

Figure 5:
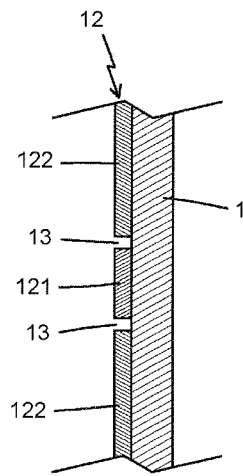
FIG. 5 is a lateral cross section view about the line C-C in FIG. 4.

Besides, a colored frame 21 formed by metal sputtering is formed between outer peripheries of a lower surface of the upper panel 2 and the upper capacitive sensing layer 22 for shielding the conductive wires 14, 24. Referring to FIG. 5, a width of each etching line is smaller than 150 μm with a depth for completely isolating the transparent conductive film so that the conductive film can be divided into two parts which are isolated completely.

In assembly, the combining layer 3 serves to combine the lower capacitive sensing layer 12 and the upper capacitive sensing layer 22 so as to form as a transparent plate. The Y traces and the X traces are arranged intersectedly. The capacitive sensing units 121a on the X traces and the capacitive sensing units 221a on the Y traces are formed as a metric so that the triggering signals from the lower capacitive sensing layer 12 and the upper capacitive sensing layer 22 are transferred to a succeeding processing circuit through the conductive wires 14, 24.

Thus, above mentioned structure can be formed with an equivalent circuit between the X traces and conductive wires 14 thereof and another equivalent circuit between the Y traces and the conductive wires 24 thereof. When a finger touches the touch panel, by the variation of the capacitance, a signal processing circuit will adjust the touching point. Thereby, the touch panel of the present invention is a highly transparent plate which can installed in front of a screen of an electronic device as an input device.

The laser etching serves for forming the etching lines on the transparent capacitive sensing units, and the ratio of hollowed portions on the lower capacitive sensing layer 12 and upper capacitive sensing layer 22 will be reduced greatly so as to have a flat appearance and uniform touch panel. Thus the distortion about the images is improved. Furthermore, since each of the waste etching areas is divided into a plurality of discontinuous small units, the capacitance of the noise will be reduced and thus the interference from noise is avoided.

Referring to FIGS. 8 to 11, the second embodiment of the present invention is illustrated. It is approximately identical to the first embodiment. The difference therebetween is that the lower capacitive sensing layer 12' is installed at a lower surface of the lower substrate V. A glued combining layer 3' serves to combine an upper capacitive sensing layer 22' of the upper panel 2' and the lower capacitive sensing layer 12' of the lower substrate 1' so as to form as a transparent plate (referring to FIG. 11). Besides, the patterns on the lower capacitive sensing layer 12' and the upper capacitive sensing layer 22' are different from one another. Namely, the etching lines 13' on the lower capacitive sensing layer 12' of the lower substrate 1' are formed as a plurality of parallel X traces 121' and a plurality of waste etching areas 122'. Each X trace 121' has a plurality of capacitive sensing units 121a' which have an oblong shape which extends along the X direction. One end of each X trace 121' is electrically connected to a single conductive wire 14'. Each of the waste etching area 122' is divided into a plurality of oblong small units 122a'. A pattern formed by a plurality of etching lines 23' on the upper capacitive sensing layer 22' at the lower surface of the upper panel 2 is divided into a plurality of parallel Y traces 221' and a plurality of waste etching areas 222'. Each capacitive sensing unit of the Y trace 221' has an oblong shape along the Y axis. One end of each Y trace 221' is electrically connected to a single conductive wire 24' at an edge of the upper panel 2'. Each waste etching area 222' is divided into a plurality of rectangular small units 222a'. Above mentioned structure has the same effect as that illustrated in the first embodiment. Thus other portions identical to the first embodiment will not be further described herein.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A capacitive touch panel comprising:
  a lower substrate (1) and an upper panel (2); an upper surface of the lower substrate (1) being installed with a lower capacitive sensing layer (12) and a lower surface of the upper substrate (1) being installed with an upper capacitive layer (22);
  a gluing combining layer (3) being installed between the lower capacitive sensing layer (12) and the upper capacitive sensing layer (22); each of the lower substrate and the upper panel being made of highly transparent material and being a planar or non-planar thin plate;
  wherein the lower capacitive sensing layer (12) is a transparent conductive thin film made of indium tin oxide; etching lines (13) are formed on the lower capacitive sensing layer (12) by etching process so as to from a predetermined pattern; the pattern on the lower capacitive sensing layer (12) is formed with a plurality of parallel X traces (121); each X trace (121) has a plurality of diamond shape capacitive sensing units (121a); one end of each X trace (121) is electrically connected to a signal conductive wire (14) at an edge of the lower substrate (1); and the waste etching area (122) on the lower capacitive sensing layer (12) out of the plurality of X traces (121) is divided into a plurality of discontinuous small units (122a) by the etching lines (13) and each small unit (122a) has a diamond shape and is enclosed by four adjacent diamond shape capacitive sensing units (121a) of the X trace (121); two adjacent small units (122a) are disconnected to one another;

wherein the upper capacitive sensing layer (22) is a transparent conductive thin film made of indium tin oxide; etching lines (23) are formed on the upper capacitive sensing layer (22) by laser etching process so as to form a predetermined pattern; the pattern on the upper capacitive sensing layer (22) is formed as a plurality of parallel Y traces (221) and a waste etching area (222); each Y trace has a plurality of diamond shape capacitive sensing units (221a); one end of each Y trace is electrically connected to a signal conductive wire (24) at an edge of the lower substrate (1); the waste etching area (222) on the upper capacitive sensing layer (22) out of the Y traces (221) is divided into a plurality of discontinuous small units (222a) by the etching lines (23) and each small unit (222a) has a diamond shape and is enclosed by four adjacent diamond shape capacitive sensing units (221a) of the Y traces (221); two adjacent small units (222a) are disconnected to one another;

wherein a colored frame (21) formed by metal sputtering is formed between outer peripheries of a lower surface of the upper panel (2) and the upper capacitive sensing layer (22) for shielding the conductive wires;

wherein in assembly, the combining layer (3) serves to combine the lower capacitive sensing layer (12) and the upper capacitive sensing layer (22) so as to form as a transparent plate; the Y traces and the X traces are arranged intersectedly; the capacitive sensing units (121a) on the X traces and the capacitive sensing units (221a) on the Y traces are formed as a metric so that the triggering signals from the lower capacitive sensing layer (12) and the upper capacitive sensing layer (22) are transferred to a succeeding processing circuit through the conductive wires.

2. The capacitive touch panel as claimed in claim 1, wherein a material of the lower substrate and the upper panel is selected from one of Polycarbonate (PC), polyester (PET), Polymethyl methacrylate (PMMA), or Cyclic olefin copolymer (COC).

3. The capacitive touch panel as claimed in claim 1, wherein combining layer (3) is selected from insulated transparent UV glue, OCA glue or IR glue.

4. The capacitive touch panel as claimed in claim 1, wherein a width of each etching line is smaller than 150 μm with a depth for completely isolating the transparent conductive film so that the conductive film can be divided into two parts which are isolated completely.

* * * * *